United States Patent
Hou et al.

(10) Patent No.: US 9,171,127 B1
(45) Date of Patent: Oct. 27, 2015

(54) LAYOUT GENERATING METHOD

(71) Applicant: UNITED MICROELECTRONICS CORP., Hsin-Chu (TW)

(72) Inventors: Chun-Liang Hou, Hsinchu County (TW); Wen-Jung Liao, Hsinchu (TW); Chi-Fang Huang, Pingtung County (TW); Yi-Jung Chang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/509,074

(22) Filed: Oct. 8, 2014

(51) Int. Cl.
G06F 17/50 (2006.01)

(52) U.S. Cl.
CPC .................................. G06F 17/5081 (2013.01)

(58) Field of Classification Search
CPC ...................................................... G03F 1/144
USPC ........................................................ 716/52
See application file for complete search history.

(56) References Cited

U.S. PATENT DOCUMENTS

| 7,904,853 B1 * | 3/2011 | Lei et al. ........................ 716/136 |
| 8,230,379 B2 | 7/2012 | Kobayashi |
| 8,434,030 B1 | 4/2013 | Hou |
| 2005/0268256 A1 * | 12/2005 | Tsai et al. ......................... 716/4 |
| 2008/0301623 A1 * | 12/2008 | Tsai et al. ....................... 716/21 |
| 2009/0193382 A1 * | 7/2009 | Melzner et al. ................. 716/13 |
| 2009/0271749 A1 * | 10/2009 | Tang et al. ........................ 716/5 |
| 2010/0185999 A1 * | 7/2010 | Graur et al. ..................... 716/20 |
| 2011/0271239 A1 * | 11/2011 | Lu et al. .......................... 716/55 |
| 2013/0031521 A1 * | 1/2013 | Teoh .............................. 716/111 |
| 2013/0219347 A1 * | 8/2013 | Zou et al. ........................ 716/52 |
| 2014/0059502 A1 * | 2/2014 | Miyoshi et al. ................. 716/52 |
| 2014/0215415 A1 * | 7/2014 | Wang et al. ..................... 716/52 |
| 2014/0223390 A1 * | 8/2014 | Sun et al. ........................ 716/52 |
| 2014/0282288 A1 * | 9/2014 | Dai et al. ........................ 716/51 |
| 2015/0161321 A1 * | 6/2015 | Cheng et al. |

* cited by examiner

Primary Examiner — Suresh Memula
(74) Attorney, Agent, or Firm — Winston Hsu; Scott Margo

(57) ABSTRACT

A design layout generating method is provided. A design layout including a first pattern and a second pattern is provided to a computer system, wherein the first pattern and the second pattern meet a design rule of an integrated circuit, respectively. The first pattern and the second pattern are combined into a third pattern. Next, the third pattern is checked if it meets a definition of a weak pattern, wherein the weak pattern is a pattern that meets the design rule but still forms defects. Then, the third pattern is modified and a new design layout is generated.

20 Claims, 7 Drawing Sheets

LAYOUT GENERATING METHOD

BACKGROUND OF THE INVENTION

1. Field of the Invention

The present invention is related to a design layout generating method, and more particularly, to a design layout generating method for weak pattern management.

2. Description of the Prior Art

As known, it takes multiple stages to fabricate an integrated circuit product from the beginning of designing the integrated circuit. Generally, some defects are possibly generated in any of the multiple stages. If the defect is found after the integrated circuit product is fabricated, it is necessary to identify the source of problems from the beginning. Under this circumstance, the speed of launching the product will be slowed down.

For solving these drawbacks, a simple rule (e.g. a minimum critical dimension) or a physical model is conventionally used in the circuit design layout in order to sieve out the area that is unable to tolerate the process variation. In such way, the weak patterns prone to error in mass production can be identified in the earlier stages. After the weak patterns are identified, the technician may try to improve the production process and eliminate the possible product weakness in the earlier stages. However, since the conventional method lacks systematical and hierarchical analyses, the estimated weak patterns are far from the real electrical performance of the product. Under this circumstance, the product yield is usually unsatisfied. Therefore, there is a need of providing an integrated circuit design and fabrication method in order to obviate the drawbacks encountered from the prior art.

SUMMARY OF THE INVENTION

According, the present invention provides a design layout generating method that is associated with weak patterns so as to upgrade the yields of the products.

According to one embodiment, a design layout generating method is provided. A design layout including a first pattern and a second pattern is provided to a computer system, wherein the first pattern and the second pattern meet a design rule of an integrated circuit, respectively. The first pattern and the second pattern are combined into a third pattern. Next, the third pattern is checked if it meets a definition of a weak pattern, wherein the weak pattern is a pattern that meets the design rule but still forms defects. Then, the third pattern is modified and a new design layout is generated.

By using the design layout generating method, the weak pattern can be checked in advance and the similar weak patterns can be fed back to the designer and inform the designer that the corresponding integrated circuit should be avoided.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
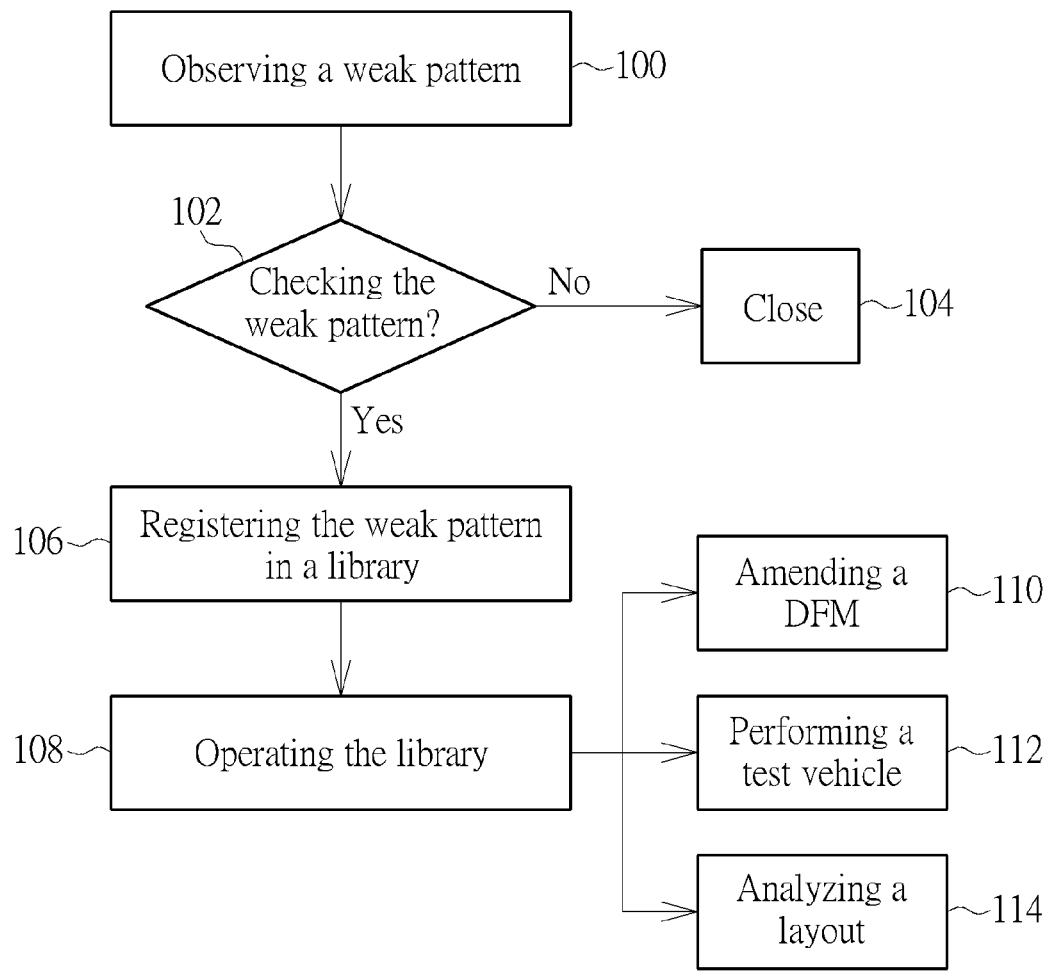
FIG. 1 shows a flow chart of the semiconductor manufacturing process for weak pattern management according to embodiment of the present invention.

Please refer to FIG. 1, which shows a flow chart of the semiconductor manufacturing process for weak pattern management according to embodiment of the present invention. As shown in FIG. 1, the semiconductor manufacturing process for weak pattern management starts by observing a weak pattern (step 100). The term "weak pattern" in the present invention refers to those patterns that are prone to error, due to some known or unknown reasons. In one preferred embodiment, the weak pattern refers to those patterns that comply with the rule of design for manufacturer (DFM) but still result in defects. The weak pattern can be observed by an in-line inspection result, OPC hotspot observation or other diagnosis process. Explanatory embodiment of the weak pattern will be given in the following context.

After the weak pattern is observed, the description of the weak pattern is recorded and then reviewed (step 102). The description of the weak pattern may include, for example, the process (for example, the 40 nm generation), the customer name, the fail mode (open/short), the weak pattern features, the cause of the weak pattern, possible solutions for the weak pattern or other parameters that can help to define and/or categorize the weak pattern in a database. The description of the weak pattern, for example, is reviewed by a committee or a computer program to decide if it is a real weak pattern or not. If the pattern is not a real weak pattern, the report will be dismissed and the process ends (step 104). If the pattern is found worthy to be recorded and the parameters can be identified, the description of the weak pattern will be registered in a weak pattern library (step 106). In one embodiment, the weak pattern will be ranked and a risk score will be given based on the urgency of the weak pattern or the frequency of the pattern.

After the datum of the weak patterns is established in the library, a variety of process can be performed for operating the library (step 108). In one embodiment, the DFM can be amended to further include some rules to avoid the weak pattern (Step 110). Accordingly, similar weak patterns can be avoided in further. In another embodiment, a test vehicle can be performed (step 112). The test vehicle may be a wafer or an area of a wafer in which a plurality of weak patterns or similar weak patterns are disposed therein. By doing this, more description of the weak pattern can be obtained and the datum of the weak pattern in the library can be refreshed. In another embodiment, the step of operating the library includes analyzing an integrated circuit by using the datum of the library (step 114). The to-be-analyzed integrated circuit may be analyzed by a computer to see if there are weak patterns or not. In this embodiment, the step of analyzing an integrated circuit may be involved in a product graphic data system (GDS) analysis process.

Figure 2:
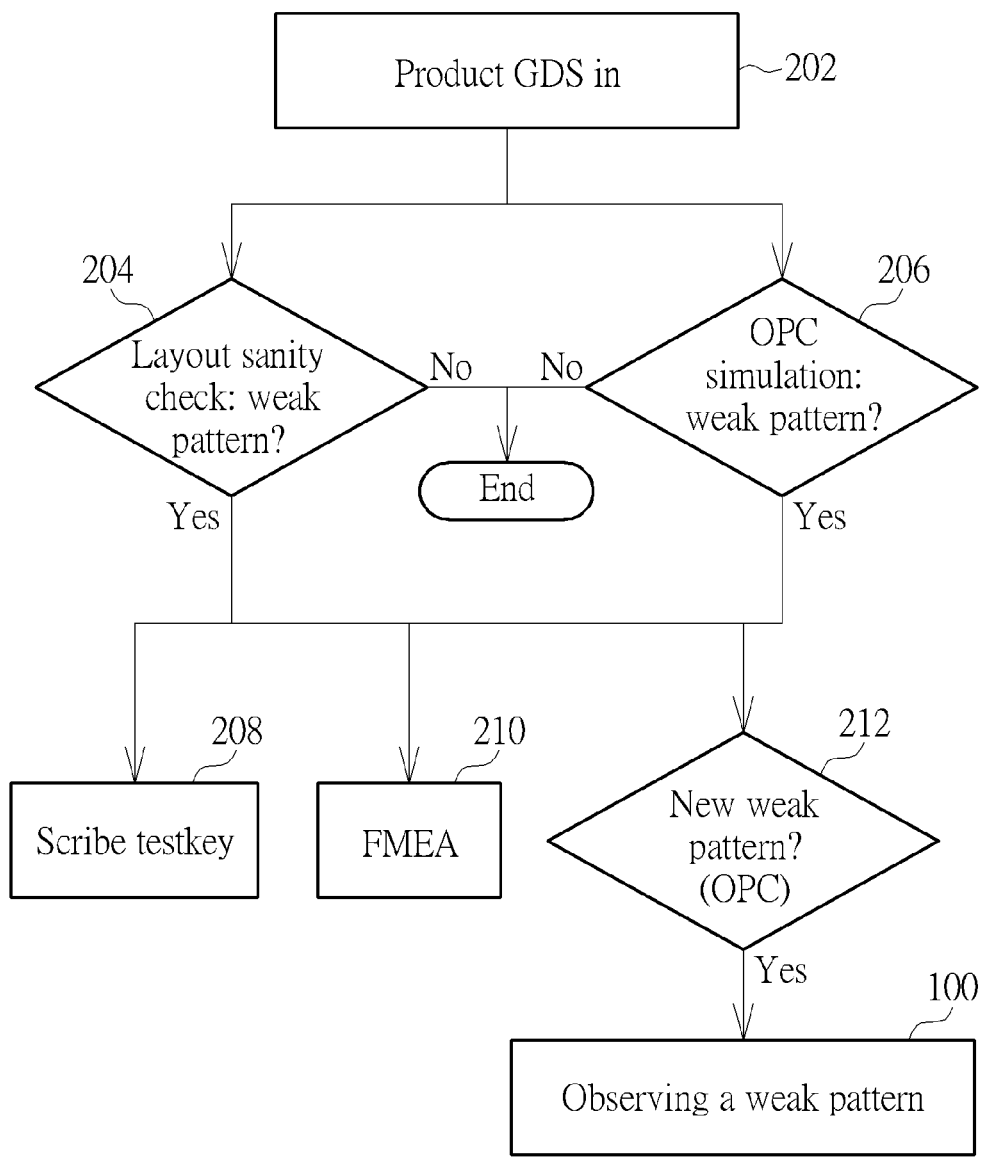
FIG. 2 shows a flow chart of a product graphic data system (GDS) analysis flow according to one embodiment of the present invention.

For detail description, please refer to FIG. 2, which shows a flow chart of a product GDS analysis flow according to one embodiment of the present invention. As shown in FIG. 2, an integrated circuit is provided (step 202). In one embodiment, the to-be-analyzed integrated circuit may be in a form of a graphic data system (GDS) file that can be analyzed by a computer. Subsequently, the layout of the integrated circuit is checked if there is a weak pattern or not (step 204). The checking step includes scanning the weak pattern library and searches if there are corresponding patterns meeting the description of the registered weak patterns. If not, the process is closed. If yes, a test key in the layout of the integrate circuit is scribed (step 208). In one embodiment, scribing a test-key includes forming a similar pattern on the same wafer having the analyzed integrated circuit or on different wafers. After the real manufacturing process, the test key is observed and the datum of the weak pattern is refreshed. In another embodiment, the integrated circuit with possible weak patterns is subjected to a failure mode and effective analysis (FMEA) process (step 210). In this embodiment, the FMEA process includes checking the datum of the weak patterns, especially the description of solutions of the weak pattern, to see if the weak pattern can be overcome. The solution is preferably amending the manufacturing process without amending the layout of the integrated circuit. If there are a lot of weak patterns, a best solution can be provided by the computer with less amendment to the manufacturing process and without forming new weak patterns. In another embodiment, when scanning the integrated circuit, an optical process correction (OPC) for the integrated circuit may be performed (step 206). After the OPC process, the corrected layout can be checked if there are weak patterns or not (step 206). If a new weak pattern is observed, it can also be checked and registered (step 100).

In some embodiments, the defining of a weak pattern may be based on the manufacturer. In general, the weak pattern refers to those patterns that meet the DFM rule but still forms defects due to some identified or unidentified reasons. The present invention specifically aims to those weak patterns that are associated with at least two adjacent areas in different layers or/and different pattern dimensions. The weak pattern associated with at least two adjacent areas in different layers means that the weak pattern is due to the layout indifferent layers, for example, the current layer and the pre-layer. The weak pattern associated with at least two adjacent areas in different dimensions means that the weak pattern is associated with a non-critical region having patterns with large size and a critical region having a nearly critical dimension (CD) size. For the detail descriptions of the two embodiments, please see the following context.

Figure 3:
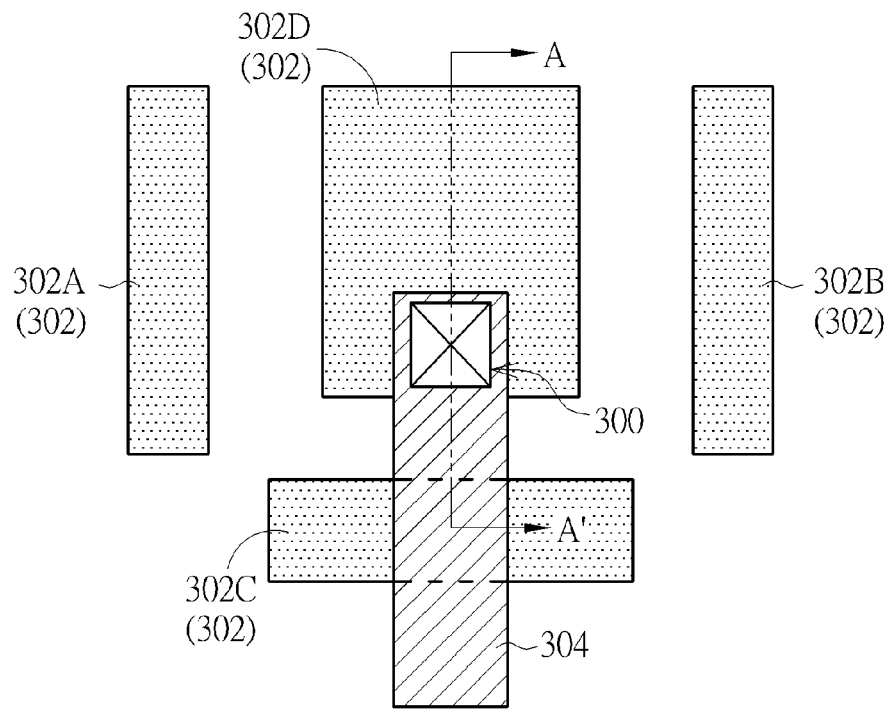
FIG. 3 to FIG. 8 show schematic diagrams of the weak pattern associated with at least two adjacent areas in different layers.
Figure 4:
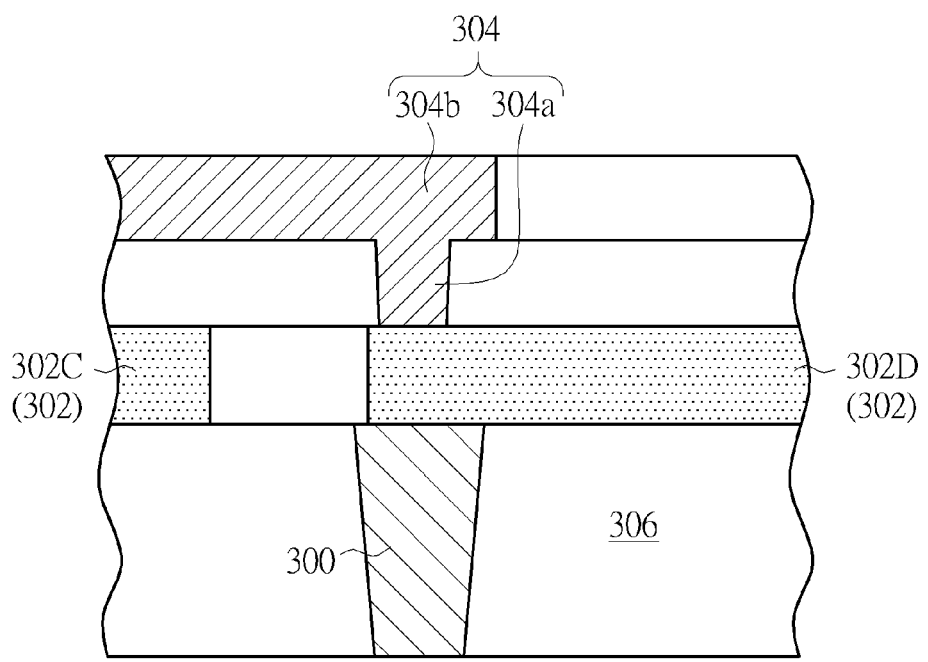
Figure 5:
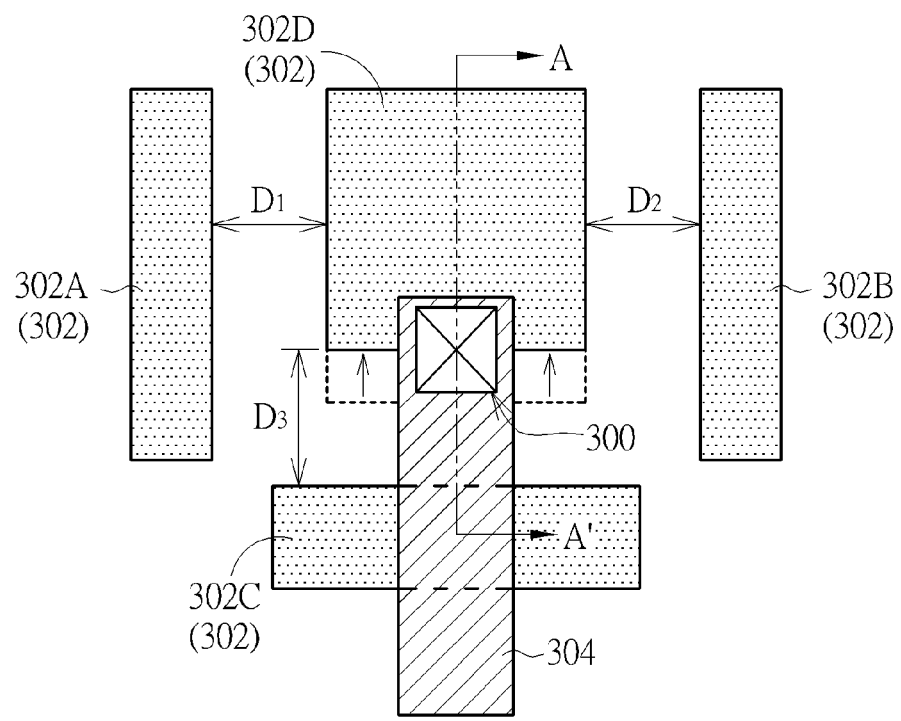
Figure 6:
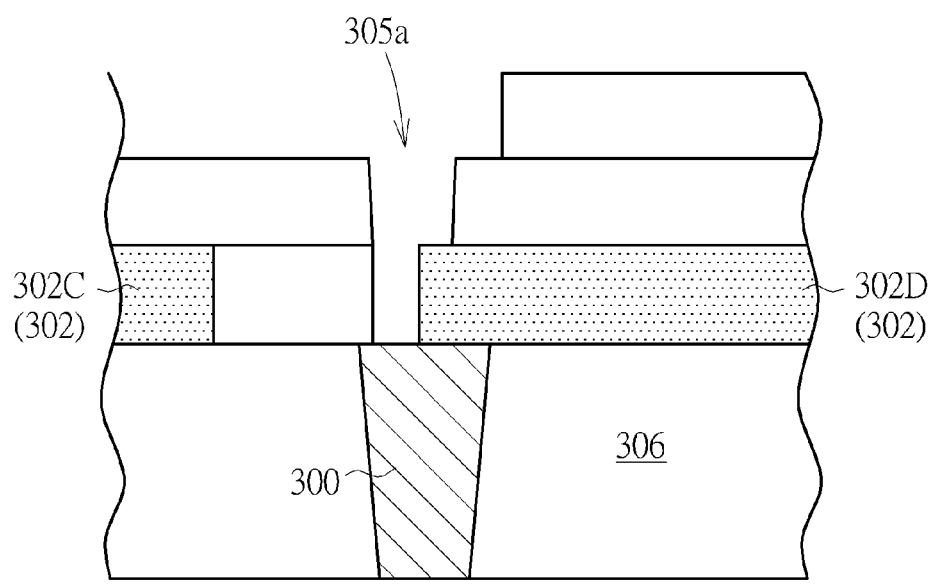
Figure 7:
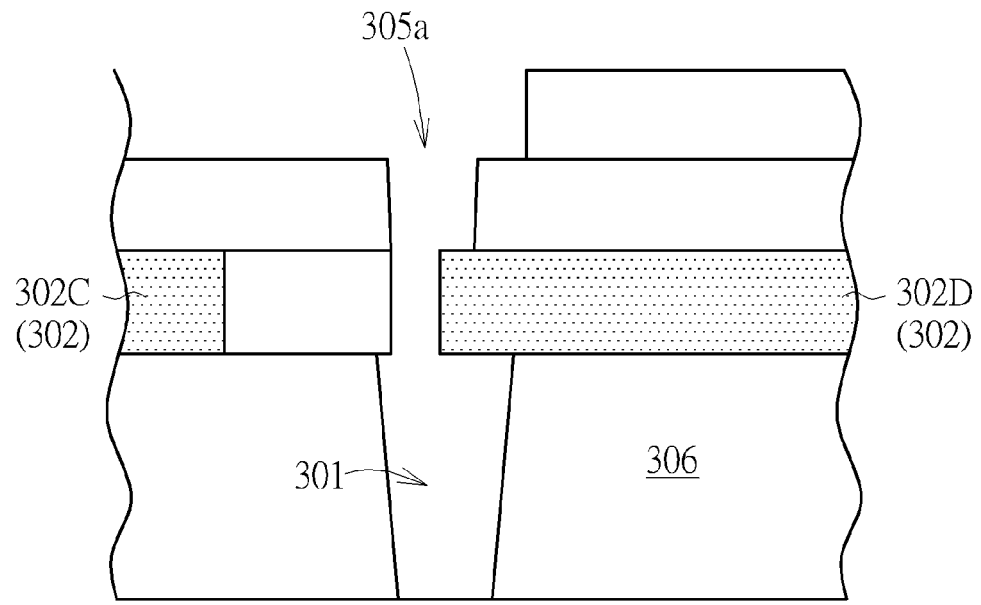
Figure 8:
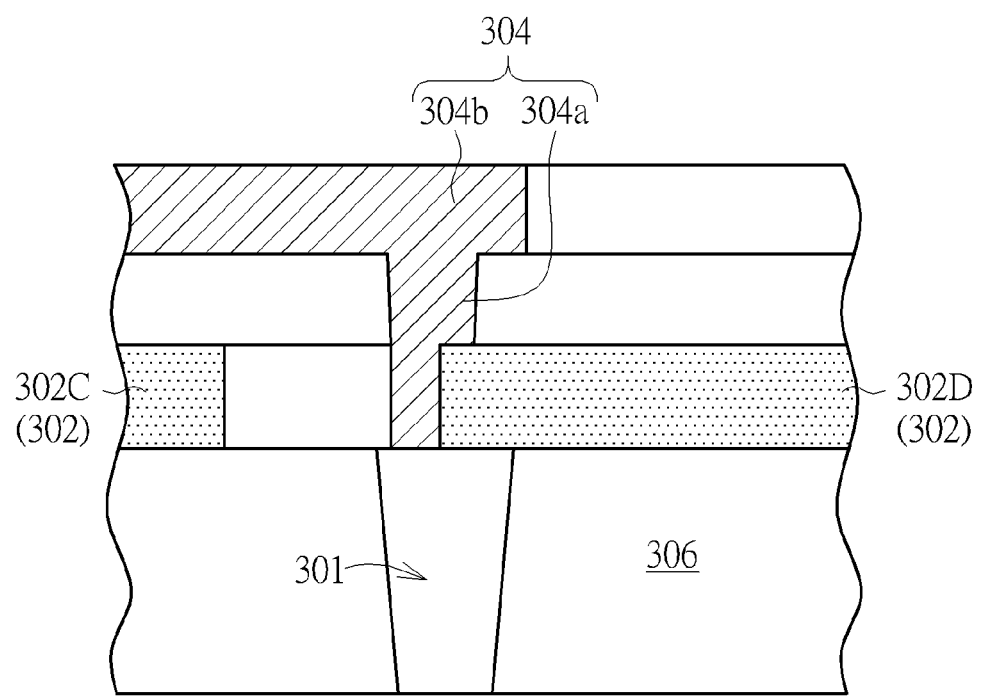

Please refer to FIG. 3 to FIG. 8, showing schematic diagrams of the weak pattern associated with at least two adjacent areas in different layers. Please see FIG. 3 and FIG. 4 at first, wherein FIG. 3 is a top view of an integrated circuit and FIG. 4 is a cross-sectional view taken along line AA' in FIG. 3. As shown in FIG. 3 and FIG. 4, a metal interconnection system comprises a contact plug 300, a first metal layer 302 (metal one, M1), a second metal layer 304 (metal two, M2), which are disposed from bottom to top in series in a plurality of dielectric layers 306. As shown in FIG. 3, the first metal layer 302 includes at least four parts: a first part 302A, a second part 302B, a third part 302C and a fourth part 302D, wherein the fourth part 302D is surrounded by the first part 302A, the second part 302B and third part 302C. From the cross-sectional view in FIG. 4, the second metal layer 304 is formed by a dual damascene process and comprises a via portion 304a and a trench portion 304b, wherein the via portion 304a lands on the fourth part 302D of the first metal layer 302. When the integrated circuit of FIG. 3 is subjected to an OPC process, some defects would happen. Please refer to FIG. 5 to FIG. 8, wherein FIG. 5 is a top view of the integrated circuit after an OPC process and FIG. 6 to FIG. 8 are cross-sectional views taken along line AA' in FIG. 5. As shown in FIG. 5, in the OPC process, the distance between each pattern is checked, for example, a distance D1 between the first part 302A and the fourth part 302D of the first metal layer 302 is checked, a distance D2 between the second part 302B and the fourth part 302D is checked, a distance D3 between the third part 302A and the fourth part 302D is checked. In one embodiment, the OPC process would amend the distance D3 by stepping back an edge of the fourth part 302D of the first metal layer 302 to a direction opposite to the third part 302C. However, this OPC process results in some defects during the real manufacturing process. As shown in FIG. 6, after forming the first metal layer 302, a dual damascene process for the second metal layer 304 is performed. A via hole 305a is formed in the dielectric layer 306. Since the edge of the fourth part 302D steps back (toward the right side in FIG. 6) and original landing location of the via hole 305a is replaced by the dielectric layer 306, the etching process for forming the via hole 305a would easily remove the dielectric layer 306, forming a via hole 305a exposing the contact plug 300. Thereafter, a conventional cleaning process is performed to clean a surface of the via hole 305a. In one embodiment, the cleaning solution is capable of etching tungsten (W) which is a conventional material for the contact plug 300. Thus, as shown in FIG. 7, the contact plug 300 made of tungsten is removed during the cleaning process, forming a contact hole 301. As shown in FIG. 8, the via hole 305a is filled with the second metal layer 304. Since the aspect ratio of the via hole 305a is changed, the second metal layer 304 cannot be formed in the contact hole 304. A short phenomenon therefore occurs. In this embodiment, although all the design of the layout as well as the OPC process meets the design rule, the short defect still happens. The patterns resulting in the short phenomenon can be seemed as a weak pattern and is associated with two adjacent areas in different layers (the contact plug 300, the first metal layer 302 and the second metal layer 304 are in different layers).

Refer back to FIG. 1. After observing the defect (step 100), the short defect shown in FIG. 8 can be defined as a weak pattern (step 102). The weak pattern is then registered in the library (step 106). In one embodiment, the description of the weak pattern may include the feature of the defect, the cause of the defect or possible solution of the defect. In detail, the feature of the defect is short phenomenon. Possible causes of the defect may be, for example: (1) one part of a metal layer is surrounded by three parts of the metal layer; (2) a below contact plug stands side to side to the metal layer; (3) an above via portion of the metal layer vertically overlaps with the below contact plug; (4) OPC process makes the metal layer steps back and some dielectric layer is disposed between the below contact plug and the above via portion. Possible solutions of the weak pattern may be, for example: (1) moving the contact plug toward the side of the fourth part so that the contact plug is not exposed during the dual damascene process; (2) changing the cleaning solution to another which does not etch the contact plug. After the weak pattern is registered to the library, the library can be operated (step 108) for further use, for example, registering a DFM (step 110), performing a test vehicle (step 112) or analyzing another integrated circuit (step 114).

Figure 9:
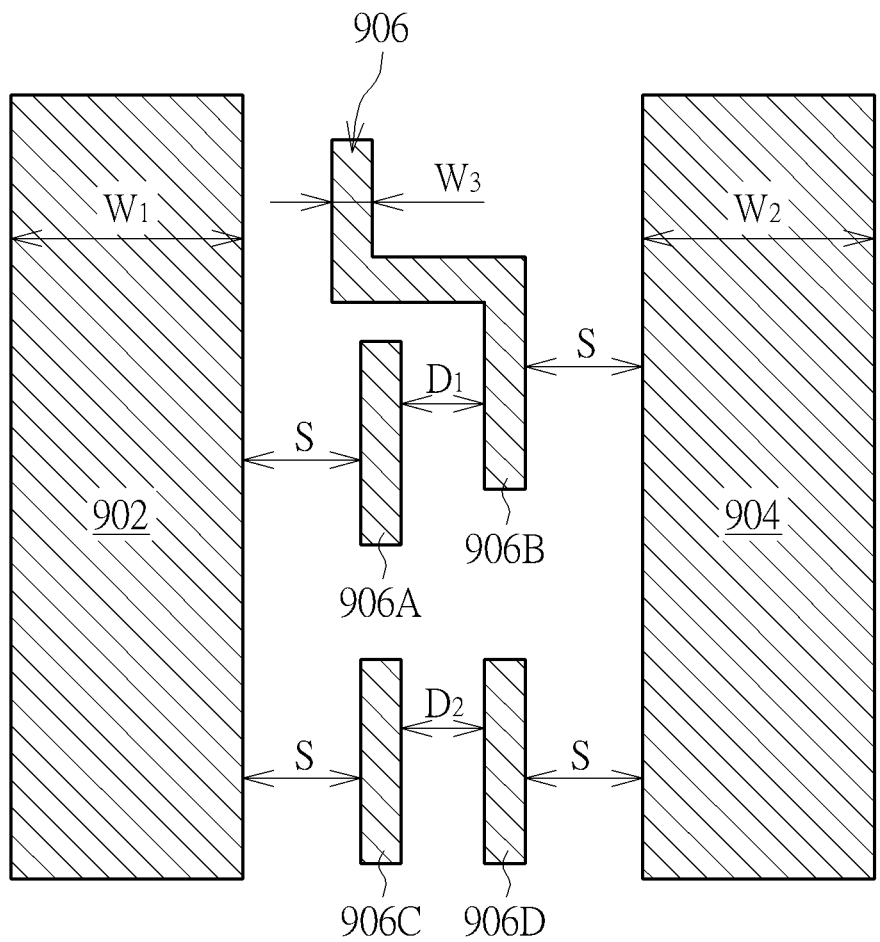
FIG. 9 shows a schematic diagram of the weak pattern associated with at least two different pattern dimensions.

Please refer to FIG. 9, which shows a schematic diagram of the weak pattern associated with at least two different pattern dimensions. As shown in FIG. 9, the integrated circuit includes a first layer 902, a second layer 904 and a plurality of third layers 906. The first layer 902 has a first width W1, the second layer 904 has a second width W2 and each third layer 906 has a third width W3. Both the first width W1 and the second width W2 are much greater than the third width W3, which is very close to the critical dimensional (CD). In one embodiment, the first width W1 and/or the second width W2 are more than 10 times of the third width W3. A gap S is between the third layer 906 and the first layer 902 or the second layer 904. A gap D is between each two of the third layers 906. For example, the gap D1 is disposed between the third layer 906A and the third layer 906B, and the gap D2 is disposed between the third layer 906C and the third layer 906D. In one embodiment, the first width W1 and the second width W2 are between 500 nm and 4500 nm, while the third width W3 is about 45 nm. The gap S is between 45 nm and 1000 nm, and the gap D1 or D2 is between 45 nm and 90 nm. Although all parameters of the integrated circuit, such as W1, W2, W3, S, D1, D2, comply with the design rule, a phenomenon called "bridge" is still occurred during the real manufacturing process. The bridge is formed between each of the two third layers 906 (with a gap D1 or D2) and making the third layer 906C and the layer 906D or the third layer 906A and the third layer 906B electrically connect. The bridge defect is caused by two adjacent layers with different dimensions (the first layer 902 and the second layer 904 have a great dimension and the third layer 904 has a smaller dimension). Though the cause of the bridge phenomenon is not well identified, the bridge phenomenon can also be defined as a weak pattern. Similar process for registering the weak pattern in the library and operating the library is shown in FIG. 1.

Figure 10:
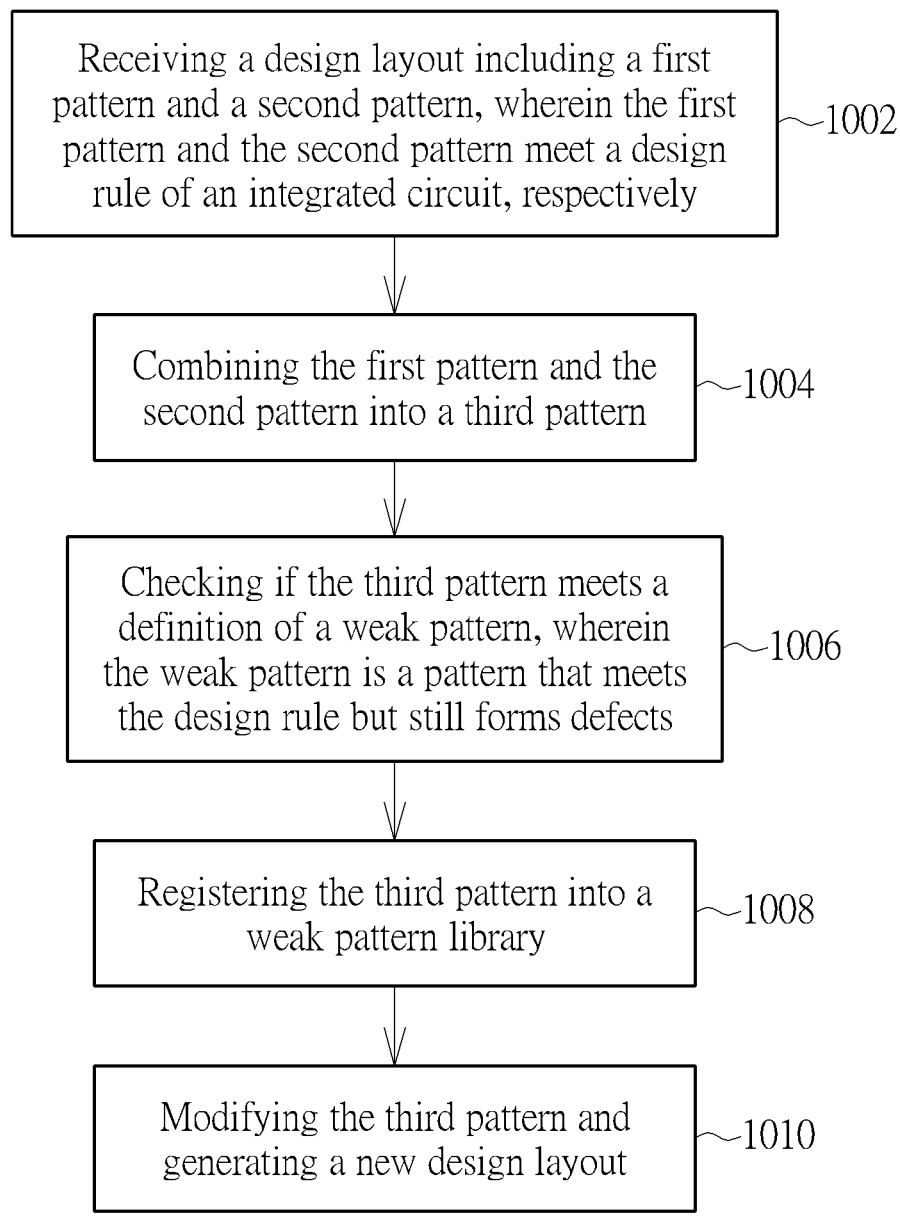
FIG. 10 shows a flow chart of the design layout generating method.

In light of above features, the present invention provides a design layout generating method. Please refer to FIG. 10, showing a flow chart of the design layout generating method. As shown in FIG. 10, the process starts by providing a design layout including a first pattern and a second pattern to a computer system, wherein the first pattern and the second pattern meet a design rule of an integrated circuit, respectively (step 1002). In one embodiment, the first pattern and the second pattern belong to different layers in the integrated circuit. For example, the first pattern or the second pattern may be the contact plug 300, the first metal layer 302 or the second metal layer 304 in FIG. 3 to FIG. 8. In another embodiment, the first pattern and the second pattern have different pattern dimensions in the integrated circuit. For example, the first pattern may be the first layer 902 or the second layer 904 while the second pattern maybe the third layer 906 in FIG. 9. Next, the first pattern and the second pattern are combined into a third pattern (step 1004). Thereafter, the third pattern is checked if it meets a definition of a weak pattern, wherein the weak pattern is a pattern that meets the design rule but still forms defects (step 1006). If the third pattern is a weak pattern, it will be registered into a weak pattern library (step 1008). In one embodiment, the description of the weak pattern to-be-registered into the library includes the feature of the weak pattern, the cause of the weak pattern, or the solution of the weak pattern, but is not limited thereto. Next, the third pattern is modified and a new design layout is generated (step 1010). In one embodiment, after modification of the third pattern, the new design layout does not have any weak patterns or have the least numbers of weak patterns. In one embodiment, the design layout is output to form at least one photo-mask. For example, the new layout corresponding to different layers of an integrated circuit may be output to form one photo-mask for one semiconductor layer and another photo-mask for another semiconductor layer in the integrated circuit. In some embodiments, one semiconductor layer of the integrated circuit involved in the new design layout may be correspond to more than one photo-masks, depending on the process design.

In one embodiment, the modification for the third pattern can be based on the weak pattern library. In one embodiment, after the registration, the weak pattern library can be operated. including registration a DFM (step 110 in FIG. 1), performing a test vehicle (step 112 in FIG. 1) or analyzing a layout (step 114 in FIG. 1). In another embodiment, the step of analyzing a layout can be involved in a product GDS analysis process, as shown in FIG. 2.

In light of above, the semiconductor manufacturing process set forth in the present invention includes establishing a weak pattern library and further operating the datum thereof. By using the semiconductor process, the weak pattern can be checked and the similar weak pattern can be fed back to the designer and inform the designer that the corresponding integrated circuit should be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A design layout generating method, comprising:
providing a design layout including a first pattern and a second pattern to a computer system, wherein the first pattern and the second pattern meet a design rule of an integrated circuit, respectively;
combining the first pattern and the second pattern into a third pattern;
checking if the third pattern meets a definition of a weak pattern, wherein the weak pattern is a pattern that meets the design rule but still forms defects; and
modifying the third pattern and generating a new design layout.

2. The design layout generating method of claim 1, wherein the first pattern and the second pattern belong to different layers in the integrated circuit.

3. The design layout generating method of claim 2, wherein the first pattern or the second pattern comprises a contact plug, a first metal layer or a second metal layer.

4. The design layout generating method of claim 3, wherein the first metal layer includes four parts and one part of the first metal layer is surrounded by other three parts.

5. The design layout generating method of claim 1, wherein the first pattern and the second pattern have different pattern dimensions in the integrated circuit.

6. The design layout generating method of claim 5, wherein the first pattern has a first width, the second layer has a second width, and the first width is greater than the second width.

7. The design layout generating method of claim 1, further comprising:
registering the third pattern into a weak pattern library.

8. The design layout generating method of claim 7, wherein the registering step comprises registering a description of the third pattern.

9. The design layout generating method of claim 8, wherein the description comprises the feature of the third pattern, the cause of the third, or the solution of third pattern.

10. The design layout generating method of claim 7, further comprising operating the weak pattern library.

11. The design layout generating method of claim 10, wherein the step of operating the weak pattern library comprises amending a DFM of the semiconductor manufacturing process according to the weak pattern library.

12. The design layout generating method of claim 10, wherein the step of operating the weak pattern library comprises forming a test vehicle on a wafer and observing the result of the test vehicle to refresh datum of the weak pattern library.

13. The design layout generating method of claim 10, wherein the step of operating the weak pattern library comprises analyzing a second integrated circuit according to the weak pattern library to see if there is a weak pattern in the layout of the second integrated circuit or not.

14. The design layout generating method of claim 13, wherein after analyzing the second integrated circuit, if a weak pattern is found, scribing a test key in a wafer with the second integrate circuit.

15. The design layout generating method of claim 13, wherein after analyzing the second integrated circuit, if a weak pattern is found, scribing a test key in another wafer.

16. The design layout generating method of claim 13, wherein after analyzing the second integrated circuit, if a weak pattern is found, performing a failure mode and effective analysis (FMEA) process.

17. The design layout generating method of claim 16, wherein the FMEA process includes amending the manufacturing process to overcome the found weak pattern.

18. The design layout generating method of claim 16, wherein the FMEA process includes searching the solutions of the found weak pattern in the weak pattern library.

19. The design layout generating method of claim 17, wherein after the amending process, no further weak pattern is formed.

20. The design layout generating method of claim 13, wherein when analyzing the layout of the second integrated circuit, an OPC process is performed for the second integrated circuit.

* * * * *